(12) United States Patent
Kanrei

(10) Patent No.: US 11,075,305 B2
(45) Date of Patent: Jul. 27, 2021

(54) SEMICONDUCTOR DEVICE

(71) Applicant: KABUSHIKI KAISHA TOSHIBA, Minato-ku (JP)

(72) Inventor: Nobuki Kanrei, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/116,064

(22) Filed: Aug. 29, 2018

(65) Prior Publication Data

US 2019/0088795 A1 Mar. 21, 2019

(30) Foreign Application Priority Data

Sep. 21, 2017 (JP) .............................. JP2017-181248

(51) Int. Cl.
| | |
|---|---|
| *H01L 29/786* | (2006.01) |
| *H01L 29/24* | (2006.01) |
| *H01L 29/792* | (2006.01) |
| *H01L 27/11568* | (2017.01) |
| *H01L 27/11582* | (2017.01) |
| *H01L 29/51* | (2006.01) |

(52) U.S. Cl.
CPC .. *H01L 29/78696* (2013.01); *H01L 27/11568* (2013.01); *H01L 27/11582* (2013.01); *H01L 29/24* (2013.01); *H01L 29/513* (2013.01); *H01L 29/517* (2013.01); *H01L 29/7869* (2013.01); *H01L 29/78642* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 2007/0194379 A1 | 8/2007 | Hosono et al. | |
| 2009/0321731 A1* | 12/2009 | Jeong | H01L 29/4908 257/43 |
| 2011/0127520 A1* | 6/2011 | You | H01L 29/78678 257/43 |
| 2013/0015437 A1 | 1/2013 | Yamazaki | |
| 2013/0082262 A1 | 4/2013 | Honda et al. | |
| 2016/0079268 A1* | 3/2016 | Sakuma | H01L 27/11582 257/43 |

(Continued)

FOREIGN PATENT DOCUMENTS

| | | |
|---|---|---|
| CN | 101621075 A | 1/2010 |
| JP | 2010-16348 A | 1/2010 |
| JP | 2010-74061 A | 4/2010 |

(Continued)

*Primary Examiner* — Robert K Carpenter
(74) *Attorney, Agent, or Firm* — Oblon, McClelland, Maier & Neustadt, L.L.P.

(57) ABSTRACT

According to one embodiment, the oxide semiconductor layer contains at least one of indium (In) and tin (Sn). The insulating film is provided between the control electrode and the oxide semiconductor layer, and contains silicon oxide. The metal oxide film is provided between the insulating film and the oxide semiconductor layer, and contacts the insulating film and the oxide semiconductor layer. The metal oxide film contains at least one selected from a group consisting of gallium (Ga), tungsten (W), germanium (Ge), aluminum (Al), molybdenum (Mo), and titanium (Ti).

15 Claims, 6 Drawing Sheets

(56) References Cited

U.S. PATENT DOCUMENTS

2016/0351576 A1   12/2016   Yamazaki et al.

FOREIGN PATENT DOCUMENTS

| JP | 2010-219538 | 9/2010 |
| JP | 2013-42121 A | 2/2013 |
| JP | 2013-84940 A | 5/2013 |
| JP | 2016-63027 A | 4/2016 |
| JP | 2016-225614 A | 12/2016 |
| WO | WO 2017/017966 A1 | 2/2017 |
| WO | 2017/115209 A1 | 7/2017 |

* cited by examiner

| CALCULATION MODEL NAME | NUMBER OF ATOMS | | | | |
|---|---|---|---|---|---|
| | In | Ga | Si | O | TOTAL |
| Model L | 16 | 16 | 4 | 56 | 92 |
| Model U | 12 | 12 | 10 | 56 | 90 |

| ELEMENT (ION) | CHARGE NUMBER | COORDINATION NUMBER | ION RADIUS (Å) | ION RADIUS (pm) |
|---|---|---|---|---|
| O | -2 | 2 | 1.35 | 135 |
| | | 3 | 1.36 | 136 |
| | | 4 | 1.38 | 138 |
| | | 6 | 1.4 | 140 |
| | | 8 | 1.42 | 142 |
| In | 3 | 4 | 0.62 | 62 |
| | | 6 | 0.8 | 80 |
| | | 8 | 0.92 | 92 |
| Sn | 4 | 4 | 0.55 | 55 |
| | | 5 | 0.62 | 62 |
| | | 6 | 0.69 | 69 |
| | | 7 | 0.75 | 75 |
| | | 8 | 0.81 | 81 |
| Si | 4 | 4 | 0.26 | 26 |
| Ga | 3 | 4 | 0.47 | 47 |
| | | 5 | 0.55 | 55 |
| | | 6 | 0.62 | 62 |
| Ge | 4 | 4 | 0.39 | 39 |
| | | 6 | 0.53 | 53 |
| Al | 3 | 4 | 0.39 | 39 |
| | | 5 | 0.48 | 48 |
| | | 6 | 0.535 | 53.5 |
| W | 5 | 6 | 0.62 | 62 |
| | 6 | 4 | 0.42 | 42 |
| | | 5 | 0.51 | 51 |
| | | 6 | 0.6 | 60 |
| Mo | 5 | 4 | 0.46 | 46 |
| | | 6 | 0.61 | 61 |
| | 6 | 4 | 0.41 | 41 |
| | | 5 | 0.5 | 50 |
| | | 6 | 0.59 | 59 |
| Ti | 4 | 4 | 0.42 | 42 |
| | | 5 | 0.55 | 55 |
| | | 6 | 0.605 | 60.5 |

FIG. 7

SEMICONDUCTOR DEVICE

CROSS-REFERENCE TO RELATED APPLICATION

This application is based upon and claims the benefit of priority from Japanese Patent Application No. 2017-181248, filed on Sep. 21, 2017; the entire contents of which are incorporated herein by reference.

FIELD

Embodiments described herein relate generally to a semiconductor device.

BACKGROUND

A thin film transistor having an oxide semiconductor made of a multielement compound as a channel layer is proposed. In the thin film transistor, it is desired to suppress defects (interface states) occurring at the interface between the channel layer and the gate insulating film to form a good interface.

BRIEF DESCRIPTION OF THE DRAWINGS

FIG. 7 is a table showing a charge number, a coordination number, and ion radius of elements (ions).

DETAILED DESCRIPTION

Figures 1, 2:
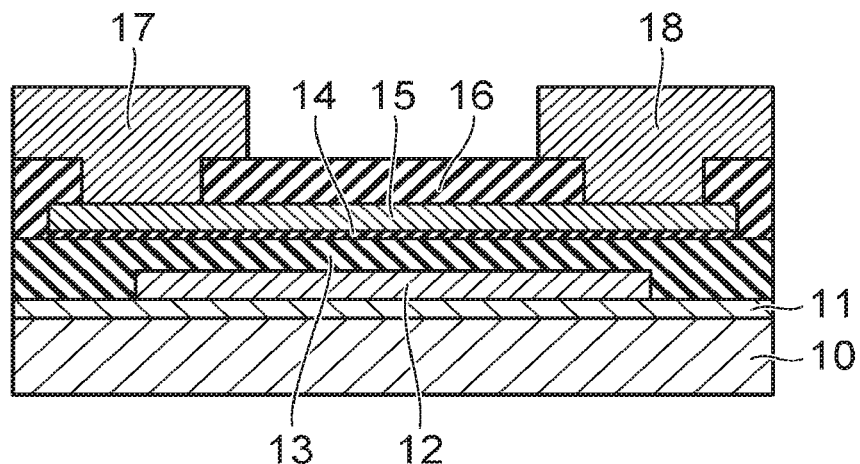
FIG. 1 is a schematic sectional view showing a semiconductor device according to an embodiment of the invention.
FIG. 2 is a table showing calculation models used for simulation analysis in a local structure of amorphous oxides.

According to one embodiment, a semiconductor device includes a control electrode, an oxide semiconductor layer, an insulating film, and a metal oxide film. The oxide semiconductor layer contains at least one of indium (In) and tin (Sn). The insulating film is provided between the control electrode and the oxide semiconductor layer, and contains silicon oxide. The metal oxide film is provided between the insulating film and the oxide semiconductor layer, and contacts the insulating film and the oxide semiconductor layer. The metal oxide film contains at least one selected from a group consisting of gallium (Ga), tungsten (W), germanium (Ge), aluminum (Al), molybdenum (Mo), and titanium (Ti).

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIG. 1 is a schematic sectional view showing a semiconductor device according to an embodiment of the invention. The semiconductor device shown in FIG. 1 is e.g. a thin film transistor of the bottom gate type.

A foundation film 11 is provided on a substrate 10. A gate electrode 12 is provided as a control electrode on the foundation film 11. For instance, the substrate 10 is a silicon substrate. The foundation film 11 is a silicon oxide film or silicon nitride film. The gate electrode 12 contains metal.

A gate insulating film 13 is provided on the foundation film 11 and the gate electrode 12. The gate insulating film 13 contains silicon oxide (Si—O bond) as the main ingredient. The gate insulating film 13 is e.g. a silicon oxide film ($SiO_2$ film). The gate insulating film 13 may be e.g. a silicon oxynitride film ($SiO_xN_y$ film) as long as it is made of a material containing silicon oxide (Si—O bond) as the main ingredient.

The gate insulating film 13 and a metal oxide film 14 are provided between the gate electrode 12 and an oxide semiconductor layer 15. The metal oxide film 14 is provided between the gate insulating film 13 and the oxide semiconductor layer 15.

The metal oxide film 14 is in contact with the gate insulating film 13 and the oxide semiconductor layer 15. The thickness of the metal oxide film 14 is thinner than the thickness of the gate insulating film 13 and thinner than the thickness of the oxide semiconductor layer 15. The thickness of the metal oxide film 14 depends on the coordination structure of the cluster formed from metal atoms and oxygen atoms. In view of the influence on the dielectric constant of the gate insulating film, the thickness of the metal oxide film 14 is preferably 3 nm or less.

A protective film 16 is provided on the oxide semiconductor layer 15. The protective film 16 is an insulating film for protecting the surface of the oxide semiconductor layer 15.

A source electrode 17 and a drain electrode 18 are provided on the oxide semiconductor layer 15 and the protective film 16. The source electrode 17 and the drain electrode 18 are in contact with the oxide semiconductor layer 15 and electrically connected to the oxide semiconductor layer 15.

The oxide semiconductor layer 15 functions as a channel layer of the thin film transistor. The current (carrier) flowing in the oxide semiconductor layer 15 between the source electrode 17 and the drain electrode 18 is controlled by applying voltage to the gate electrode 12.

The oxide semiconductor layer 15 contains at least one of indium (In) and tin (Sn). The oxide semiconductor layer 15 contains a bond of a metal atom and an oxygen atom, i.e. at least one of an In—O bond and a Sn—O bond.

Furthermore, the oxide semiconductor layer 15 may contain at least one selected from the group consisting of gallium (Ga), silicon (Si), germanium (Ge), aluminum (Al), tungsten (W), titanium (Ti), tantalum (Ta), zirconium (Zr), hafnium (Hf), niobium (Nb), antimony (Sb), and zinc (Zn).

The metal oxide film 14 contains at least one selected from the group consisting of gallium (Ga), tungsten (W), germanium (Ge), aluminum (Al), molybdenum (Mo), and titanium (Ti). The metal oxide film 14 contains a bond of a metal atom and an oxygen atom, i.e. at least one selected from the group consisting of a Ga—O bond, a W—O bond, a Ge—O bond, an Al—O bond, a Mo—O bond, and a Ti—O bond.

In the thin film transistor including a channel layer based on oxide semiconductor, defects (interface states) occur at the interface between the oxide semiconductor and the gate insulating film (e.g. silicon oxide film). This may cause instability of electrical characteristics of the thin film transistor such as dispersion or variation of threshold voltage and decrease of carrier mobility.

In contrast, according to the embodiment of the invention, the metal oxide film 14 is provided between the oxide semiconductor layer 15 and the gate insulating film 13. As described later, the metal oxide film 14 has the effect of matching the local structure at the interface between the oxide semiconductor layer 15 and the gate insulating film 13. Thus, the metal oxide film 14 functions as an interface control layer. The metal oxide film 14 thus provided can suppress defects occurring at the interface between the oxide semiconductor layer 15 and the gate insulating film 13 without damaging the film quality of the gate insulating film 13. Use of oxide semiconductor provided with such an interface control layer improves the reliability of the semiconductor device and achieves high mobility.

Oxide semiconductor is a compound of metal and oxygen. There is a large difference in electronegativity between the metal atom and the oxygen atom. Thus, ionic bonding is generally strong in oxide semiconductor. A metal ion may be regarded as a positively charged rigid ball, and an oxygen ion may be regarded as a negatively charged rigid sphere. Then, the structure of an oxide semiconductor can be explained by an ion cluster model. This is based on the idea that ions assumed to be charged rigid spheres electrostatically interact with each other.

It may be assumed that the oxide semiconductor is an aggregation of clusters formed from metal atoms and oxygen atoms. Then, the coordination structure of each cluster can be considered as a polygon in which a plurality of oxygen atoms coordinate around one metal atom. The coordination number that can be assumed by a metal atom depends on the property specific to the element. Thus, the coordination structure of the oxide cluster can be predicted from the coordination number.

In general, in the case where one metal atom (ion) can assume different coordination structures, the ion radius is proportional to the coordination number and inversely proportional to the charge number. Thus, it is considered that a metal element having a large ion radius is likely to form a cluster of high coordination structure. A metal element having a small ion radius is likely to form a cluster of low coordination structure.

FIG. 7 is a table showing the charge number, coordination number, and ion radius of elements (ions) cited from R. D. Shannon's database. The ion radius is with reference to the $O^{2-}$ ion with coordination number 6 (140 pm).

Oxide semiconductors are often based on metal elements having a large principal quantum number such as In and Sn. In and Sn both have a large ion radius. Thus, a cluster of indium oxide and tin oxide generally assumes a high coordination structure. For instance, indium oxide ($In_2O_3$) is known to form an octahedral cluster in which six oxygen atoms coordinate around an In atom. In contrast, Si has an extremely small ion radius. For instance, silicon oxide ($SiO_2$) dominantly forms a tetrahedral cluster in which four oxygen atoms coordinate around a Si atom.

In a thin film transistor including a channel layer made of oxide semiconductor based on In or Sn, for instance, a silicon oxide film is applied to the gate insulating film. Then, there is a discrepancy in the coordination structure of the cluster. Thus, it is presumed that defects (interface states) due to bonding failure occur at the interface between the channel layer and the gate insulating film.

Thus, in order to suppress defects due to bonding failure at the interface of heterogeneous oxides, an interface control layer for matching the local structure of the interface is needed between the oxide semiconductor layer containing clusters of high coordination structure and the gate insulating film containing clusters of low coordination structure.

Specifically, it is preferable to provide an oxide (metal oxide film 14) between the oxide semiconductor layer 15 containing at least one of In and Sn and the gate insulating film 13 containing silicon oxide. The metal oxide film 14 contains a metal element having an ion radius being not less than 26 pm and not more than 62 pm corresponding to approximately the middle of the ion radius of In or Sn and the ion radius of Si and being capable of having a coordination number being not less than 4 and not more than 6.

From FIG. 7, the foregoing condition is satisfied by Ga having a coordination number of 4, 5, 6, Ge having a coordination number of 4, 6, Al having a coordination number of 4, 5, 6, W having a coordination number of 4, 5, 6, Mo having a coordination number of 4, 5, 6, and Ti having a coordination number of 4, 5, 6. Thus, a metal oxide film containing at least one selected from the group consisting of Ga, Ge, Al, W, Mo, and Ti is preferable. This facilitates connection to the clusters contained in both the oxide semiconductor layer 15 and the gate insulating film 13. Thus, the local structure at the interface can be matched.

In order to clarify the orderedness in the local structure, an amorphous structure composed of In atoms, Ga atoms, Si atoms, and O (oxygen) atoms was modeled to perform local structure analysis at a temperature of 300 Kelvin using the first-principles molecular dynamics method. The simulation model of the amorphous structure was produced by the melt-and-quench method.

FIG. 2 is a table showing calculation models used for simulation analysis in the local structure of amorphous oxides. In the model L, the number of In atoms is 16, the number of Ga atoms is 16, the number of Si atoms is 4, and the number of O atoms is 56. In the model U, the number of In atoms is 12, the number of Ga atoms is 12, the number of Si atoms is 10, and the number of O atoms is 56. The number of O atoms is set to a value satisfying the charge neutrality condition in view of the valence of In, Ga, and Si.

Figure 3:
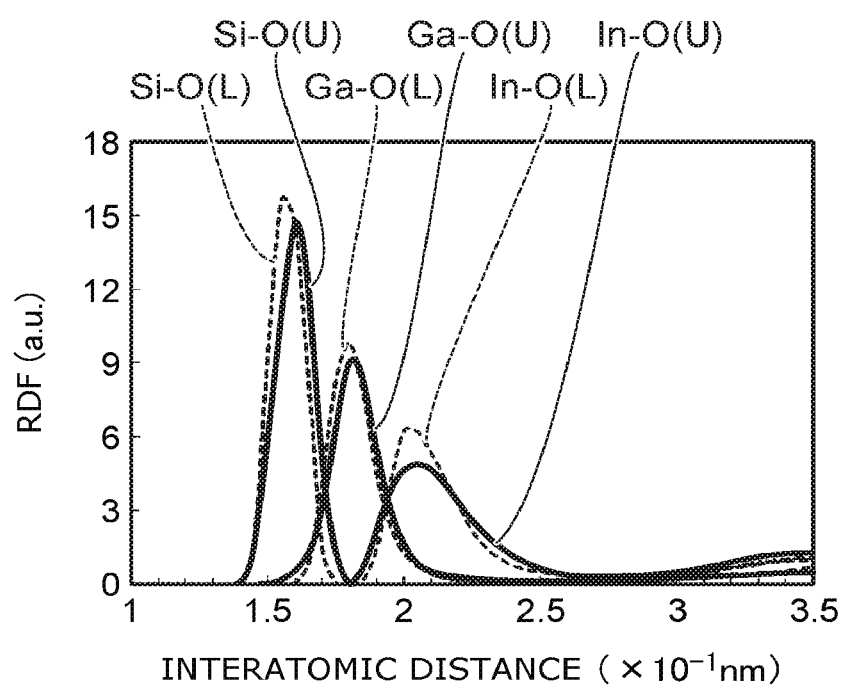
FIG. 3 is a graph showing a simulation result for models of an amorphous structure composed of In, Ga, Si, and O.

FIG. 3 is a simulation result for the models of the amorphous structure composed of In, Ga, Si, and O. FIG. 3 shows the radial distribution function of the model L (dashed line) and the model U (solid line). The horizontal axis represents the interatomic distance between Si and O (Si—O), the interatomic distance between Ga and O (Ga—O), and the interatomic distance between In and O (In—O). RDF (radial distribution function) on the vertical axis represents the existence ratio normalized by the number of atoms.

As seen from FIG. 3, in both the model L and the model U, the In—O bond distance is the longest, and the Si—O bond distance is the shortest. The half-width in the radial distribution of Si—O is extremely narrower than that of In—O. Such a radial distribution function is a valid result reflecting the property of In having a large ion radius and Si having a small ion radius. On the other hand, it is found that the radial distribution of Ga—O is located generally in the middle of Si—O and In—O.

Figure 4A:
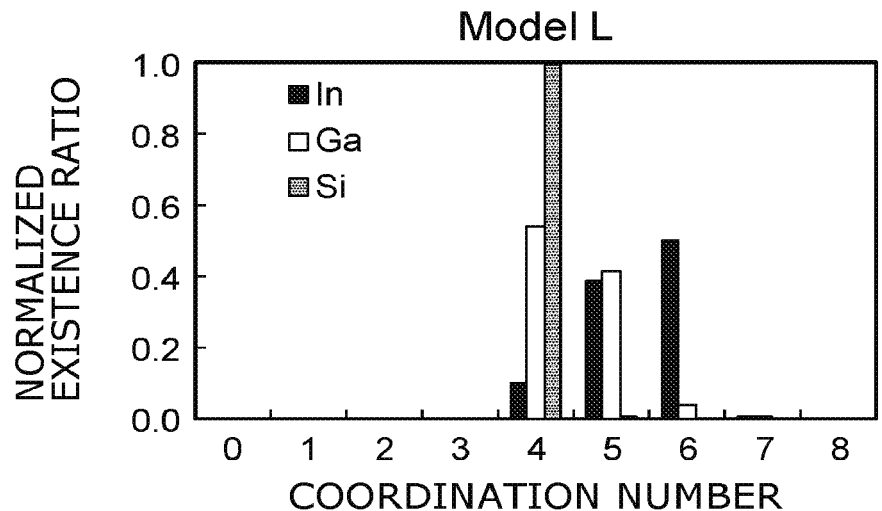
FIGS. 4A and 4B are graphs showing simulation results for models of an amorphous structure composed of In, Ga, Si, and O.
Figure 4B:
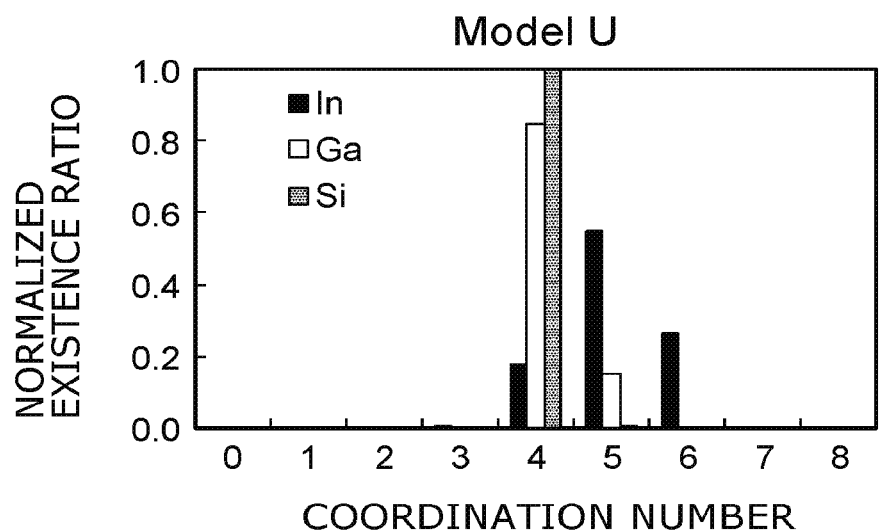

FIGS. 4A and 4B are simulation results for the models of the amorphous structure composed of In, Ga, Si, and O. FIG. 4A is a result for the model L, and FIG. 4B is a result for the model U. FIGS. 4A and 4B show the coordination number distribution in the first coordination for each of the In atom, Ga atom, and Si atom.

Here, the atom is assumed to be a rigid sphere. Based on the radial distribution function shown in FIG. 3, normalization is performed by the number of O atoms existing within the range of a radius of 0.26 nm from the atom of interest. The coordination structure of the cluster can be identified by analyzing the coordination number in the first coordination for each of the In atom, Ga atom, and Si atom.

FIG. 4A shows the model L containing a smaller number of Si. In this case, the In—O cluster primarily assumes a 6-coordination or 5-coordination structure. The Ga—O cluster primarily assumes a 4-coordination or 5-coordination structure. The Si—O cluster dominantly assumes a 4-coordination structure. Thus, it is considered that the In—O cluster is connected to the Ga—O cluster primarily in the 5-coordination structure. The Si—O cluster is connected primarily to the Ga—O cluster having the 4-coordination structure.

FIG. 4B shows the model U in which the number of Si is increased. In this case, the 4-coordination structure increases in Ga—O clusters, the 5-coordination structure increases in the In—O clusters. Both clusters assume a lower coordination number. It is found that the Si—O cluster dominantly assumes a 4-coordination structure as in the model L.

From the analysis result of the coordination number of FIGS. 4A and 4B, it is interpreted that the structure relaxation is achieved by the changing coordination structure of Ga because the Si—O cluster maintains a robust tetrahedral structure irrespective of composition.

From the foregoing results of simulation analysis, it is found that the coordination structure of the cluster formed from metal atoms and oxygen atoms is determined by the property specific to the elements and is an important factor determining the connection configuration between the clusters. The Ga—O cluster is easily connected to both a cluster of low coordination structure and a cluster of high coordination structure. Thus, it is considered that the Ga—O cluster is effective for an interface control layer between an oxide semiconductor and an insulating film.

Thus, the metal oxide film 14 containing Ga is provided between the oxide semiconductor layer 15 and the gate insulating film 13. This can suppress defects due to bonding failure at the interface between the oxide semiconductor layer 15 and the gate insulating film 13.

Like Ga, a metal element such as Ge, Al, W, Mo, and Ti has an ion radius being not less than 26 pm and not more than 62 pm corresponding to approximately the middle of the ion radius of In or Sn and the ion radius of Si, and can have a coordination number being not less than 4 and not more than 6. The metal oxide film 14 containing such a metal element may be provided between the oxide semiconductor layer 15 and the gate insulating film 13. This can also match the local structure of the interface. Thus, defects due to bonding failure can be suppressed at the interface between the oxide semiconductor layer 15 and the gate insulating film 13.

Furthermore, for instance, Ga and W have an ion radius extremely close to each other. Thus, a metal oxide film containing a composite oxide of Ga and W is also effective for an interface control layer between the oxide semiconductor layer 15 and the gate insulating film 13. Accordingly, the metal oxide film 14 can also contain a plurality of elements selected from the group consisting of Ga, Ge, Al, W, Mo, and Ti.

Figure 5:
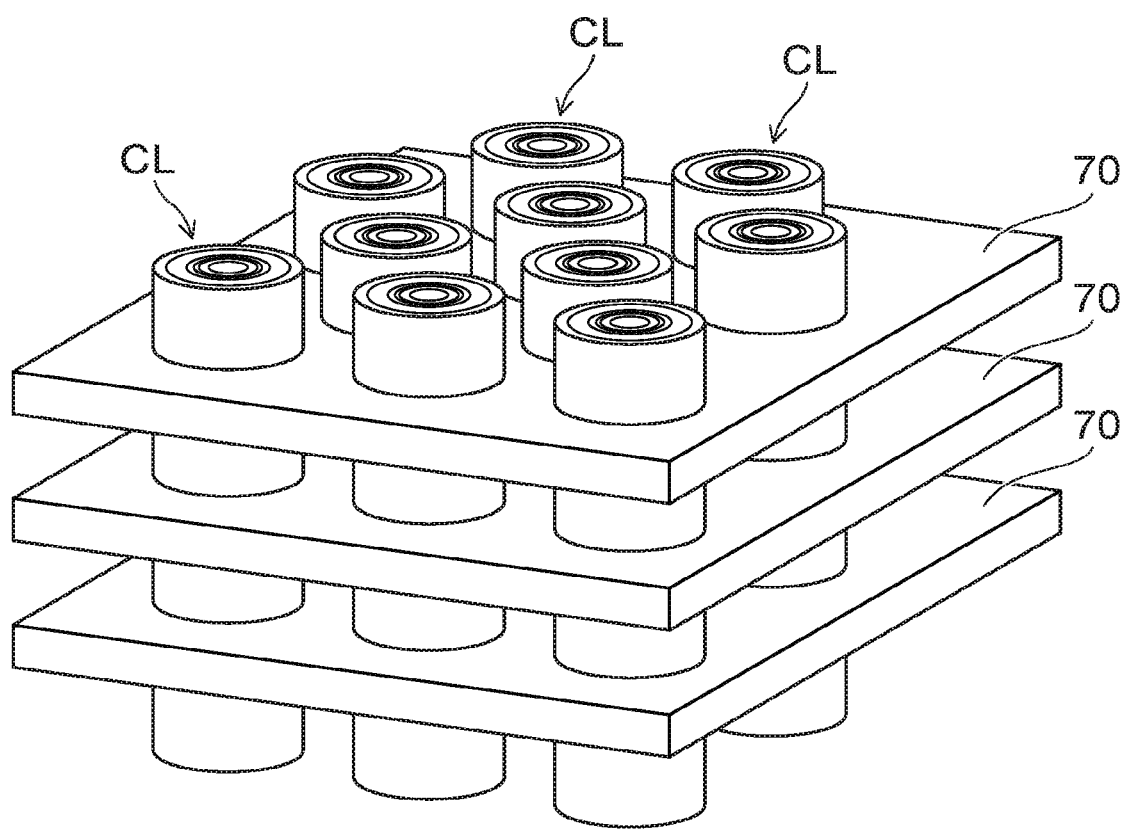
FIG. 5 is a schematic perspective view of a semiconductor device according to an alternative embodiment.

FIG. 5 is a schematic perspective view of a semiconductor device according to an alternative embodiment.

Figure 6A:
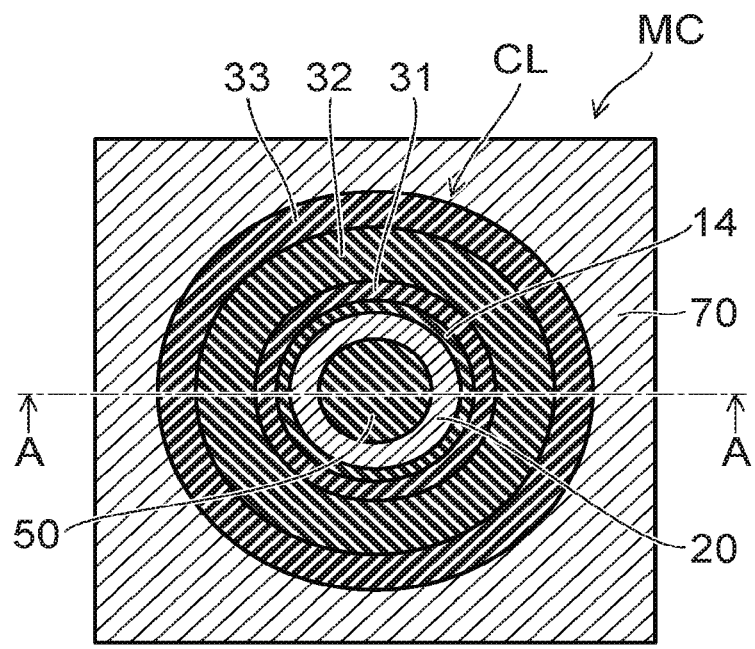
FIG. 6A is a schematic sectional view of the semiconductor device according to the alternative embodiment.
Figure 6B:
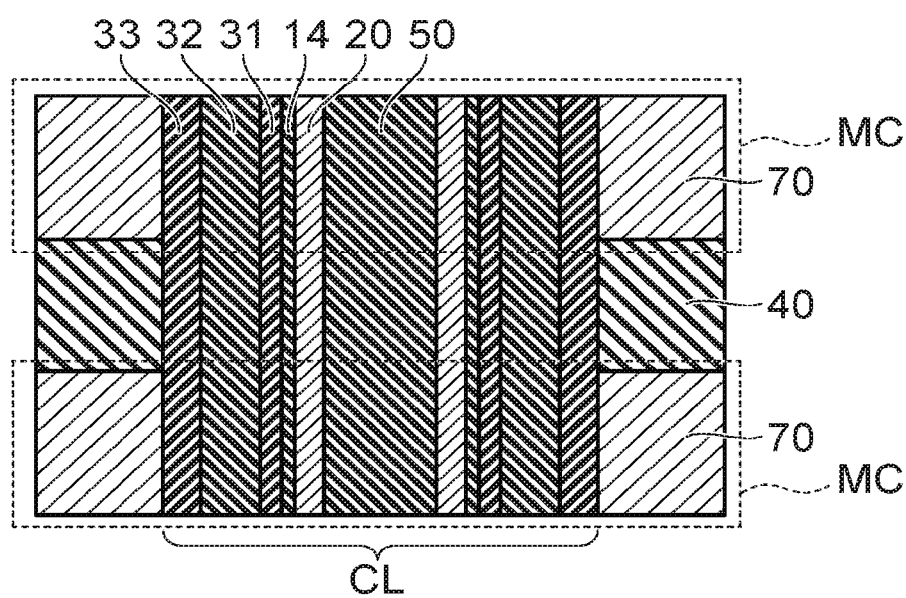
FIG. 6B is a sectional view taken along A-A in FIG. 6A.

FIG. 6A is a schematic transverse sectional view of the semiconductor device shown in FIG. 5. FIG. 6B is a sectional view taken along A-A in FIG. 6A.

The semiconductor device illustrated in FIGS. 5, 6A, and 6B is e.g. a memory device of three-dimensional structure.

A plurality of layers of word electrodes (control electrodes) 70 are stacked with an insulator (insulating layer or air gap) interposed. A plurality of columnar parts CL penetrate through the stacked body including the plurality of layers of word electrodes 70. The side surface of the columnar part CL is surrounded with the word electrode 70.

As shown in FIGS. 6A and 6B, the columnar part CL includes a memory film, an oxide semiconductor layer 20, and an insulating core film 50. The oxide semiconductor layer (oxide semiconductor body) 20 is formed like a pipe. The core film 50 is provided inside the oxide semiconductor layer 20. The memory film is provided between the word electrode 70 and the oxide semiconductor layer 20 and surrounds the periphery of the oxide semiconductor layer 20.

The oxide semiconductor layer 20 contains at least one of indium (In) and tin (Sn) like the oxide semiconductor layer 15 described above. That is, the oxide semiconductor layer 20 contains at least one of an In—O (indium-oxygen) bond and a Sn—O (tin-oxygen) bond.

Furthermore, the oxide semiconductor layer 20 may contain at least one selected from the group consisting of gallium (Ga), silicon (Si), germanium (Ge), aluminum (Al), tungsten (W), titanium (Ti), tantalum (Ta), zirconium (Zr), hafnium (Hf), niobium (Nb), antimony (Sb), and zinc (Zn).

The memory film is a stacked film including a metal oxide film 14, a tunnel insulating film 31, a charge storage film 32, and a block insulating film 33. The block insulating film 33, the charge storage film 32, the tunnel insulating film 31, and the metal oxide film 14 are provided between the word electrode 70 and the oxide semiconductor layer 20 sequentially from the word electrode 70 side.

The oxide semiconductor layer 20, the memory film, and the word electrode 70 constitute a memory cell MC. The word electrode 70 functions as a control electrode of the memory cell MC. The memory cell MC has a vertical transistor structure in which the periphery of the oxide semiconductor layer 20 is surrounded with the word electrode 70 via the memory film. In this memory cell MC of the vertical transistor structure, the oxide semiconductor layer 20 functions as a channel layer. The charge storage film 32 functions as a data storage layer for storing the charge injected from the oxide semiconductor layer 20.

Such a semiconductor device is a nonvolatile semiconductor memory device capable of electrically and freely erasing/writing data and retaining its memory content even when powered off.

The memory cell MC is e.g. a memory cell of the charge trap type. The charge storage film 32 includes a large number of trap sites for trapping charge in the insulating film, and includes e.g. a silicon nitride film.

The tunnel insulating film 31 serves as a potential barrier when charge is injected from the oxide semiconductor layer 20 into the charge storage film 32, or when the charge stored in the charge storage film 32 is released into the oxide semiconductor layer 20.

The tunnel insulating film 31 includes a silicon oxide film composed primarily of silicon oxide (Si—O bonds).

The block insulating film 33 prevents the charge stored in the charge storage film 32 from being released into the word electrode 70. The block insulating film 33 suppresses back tunneling of charge from the word electrode 70 into the columnar part CL. The block insulating film 33 includes e.g. a silicon oxide film.

The metal oxide film 14 is in contact with the silicon oxide film of the tunnel insulating film 31, and the oxide semiconductor layer 20. The thickness of the metal oxide film 14 is thinner than the thickness of the tunnel insulating film 31. The thickness of the metal oxide film 14 depends on the coordination structure of the cluster formed from metal atoms and oxygen atoms. In view of the influence on the dielectric constant of the tunnel insulating film 31, the thickness of the metal oxide film 14 is preferably 3 nm or less.

As in the above embodiment, the metal oxide film 14 contains at least one selected from the group consisting of gallium (Ga), tungsten (W), germanium (Ge), aluminum (Al), molybdenum (Mo), and titanium (Ti).

Also in the memory device shown in FIGS. 5, 6A, and 6B, the metal oxide film 14 can be provided between the oxide semiconductor layer 20 and the tunnel insulating film 31. The metal oxide film 14 functions as an interface control layer for matching the local structure of the interface between the oxide semiconductor layer 20 and the tunnel insulating film 31. This can suppress defects due to bonding failure at the interface between the oxide semiconductor layer 20 and the tunnel insulating film 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a control electrode;
   an oxide semiconductor layer containing at least one of indium oxide and tin oxide;
   an insulating film provided between the control electrode and the oxide semiconductor layer, and containing silicon oxide; and
   a metal oxide film provided between the insulating film and the oxide semiconductor layer, and contacting the insulating film and the oxide semiconductor layer, the metal oxide film containing at least one selected from a group consisting of gallium (Ga), tungsten (W), germanium (Ge), molybdenum (Mo), and titanium (Ti), aluminum (Al), molybdenum (Mo), and titanium (Ti), the metal oxide film containing at least one selected from a group consisting of a Ga—O bond, a W—O bond, a Ge—O bond, an Al—O bond, a Mo—O bond, and a Ti—O bond, wherein
   a coordination number of a metal atom of the metal oxide film at an interface between the metal oxide film and the insulating film is a first value,
   a coordination number of a metal atom of the metal oxide film at an interface between the metal oxide film and the oxide semiconductor layer is a second value, and
   the first value and the second value are different.

2. The device according to claim 1, wherein the oxide semiconductor layer further contains at least one selected from a group consisting of gallium (Ga), silicon (Si), germanium (Ge), aluminum (Al), tungsten (W), titanium (Ti), tantalum (Ta), zirconium (Zr), hafnium (Hf), niobium (Nb), antimony (Sb), and zinc (Zn), a composition ratio of the one selected from the group is lower than a composition ratio of In or Sn atom in the oxide semiconductor layer.

3. The device according to claim 1, wherein a thickness of the metal oxide film is thinner than a thickness of the insulating film.

4. The device according to claim 1, wherein a thickness of the metal oxide film is thinner than a thickness of the oxide semiconductor layer.

5. The device according to claim 1, wherein the control electrode contains a metal.

6. The device according to claim 1, further comprising a source electrode and a drain electrode contacting the oxide semiconductor layer.

7. The device according to claim 1, wherein
   the metal oxide film, the insulating film, a charge storage film, and a block insulating film are provided between the oxide semiconductor layer and the control electrode,
   the charge storage film includes a silicon nitride film,
   the block insulating film includes a silicon oxide film,
   the metal oxide film surrounds the oxide semiconductor layer shaped like a pipe,
   the insulating film surrounds the metal oxide film,
   the charge storage film surrounds the insulating film, and
   the block insulating film surrounds the charge storage film.

8. The device according to claim 7, wherein a thickness of the metal oxide film is thinner than a thickness of the insulating film and a thickness of the block insulating film.

9. The device according to claim 7, wherein
   a plurality of layers of control electrodes are stacked with an insulator interposed, and
   a columnar part including the oxide semiconductor layer, the insulating film, the metal oxide film, the charge storage film, and the block insulating film penetrates through the plurality of layers of control electrodes.

10. The device according to claim 9, further comprising an insulating core film provided inside the pipe-shaped oxide semiconductor layer.

11. The device according to claim 1, wherein the oxide semiconductor layer contains at least one of $In_2O_3$ and $SnO_2$.

12. The device according to claim 1, wherein the metal oxide film has electrical conductivity.

13. The device according to claim 1, wherein an average in a first coordination number of the metal atom is 4 or more and less than 5 at the interface between the metal oxide film and the insulating film, and is 5 or more and 6 or less at the interface between the metal oxide film and the oxide semiconductor layer.

14. The device according to claim 1, wherein an ion radius of the metal atom is not less than 39 pm and not more than 62 pm, and a peak value of an interatomic distance between the metal atom and an oxygen atom of the metal oxide film is 170 pm or more and 190 pm or less.

15. The device according to claim 1, wherein a half width (full width at half maximum) at a first proximity in a radial distribution function of the metal atom is narrower than a half width at the first proximity of In or Sn atom in the oxide semiconductor layer, and is wider than a half width at the first proximity of Si atom in the insulating film.

\* \* \* \* \*